United States Patent
Siemieniec et al.

(10) Patent No.: US 11,848,379 B2
(45) Date of Patent: *Dec. 19, 2023

(54) MOSFET HAVING A DRIFT REGION WITH A GRADED DOPING PROFILE AND METHODS OF MANUFACTURING THEREOF

(71) Applicant: Infineon Technologies Austria AG, Villach (AT)

(72) Inventors: Ralf Siemieniec, Villach (AT); David Laforet, Villach (AT); Cédric Ouvrard, Munich (DE)

(73) Assignee: Infineon Technologies Austria AG, Villach (AT)

( * ) Notice: Subject to any disclaimer, the term of this patent is extended or adjusted under 35 U.S.C. 154(b) by 99 days.

This patent is subject to a terminal disclaimer.

(21) Appl. No.: 17/482,490

(22) Filed: Sep. 23, 2021

(65) Prior Publication Data

US 2022/0013665 A1  Jan. 13, 2022

Related U.S. Application Data

(63) Continuation of application No. 16/782,869, filed on Feb. 5, 2020, now Pat. No. 11,158,735.

(51) Int. Cl.
*H01L 29/76* (2006.01)
*H01L 29/78* (2006.01)
(Continued)

(52) U.S. Cl.
CPC ...... *H01L 29/7813* (2013.01); *H01L 29/0878* (2013.01); *H01L 29/1095* (2013.01); *H01L 29/407* (2013.01)

(58) Field of Classification Search
None
See application file for complete search history.

(56) References Cited

U.S. PATENT DOCUMENTS

| | | |
|---|---|---|
| 6,388,286 B1 | 5/2002 | Baliga |
| 7,652,325 B2 | 1/2010 | Siemieniec et al. |

(Continued)

FOREIGN PATENT DOCUMENTS

| | | |
|---|---|---|
| DE | 102006049043 B4 | 3/2011 |
| DE | 102005052734 B4 | 2/2012 |

(Continued)

*Primary Examiner* — Robert K Carpenter
(74) *Attorney, Agent, or Firm* — Murphy, Bilak & Homiller, PLLC

(57) ABSTRACT

A vertical power semiconductor transistor device includes: a drain region of a first conductivity type; a body region of a second conductivity type; a drift region of the first conductivity type which separates the body region from the drain region; a source region of the first conductivity type separated from the drift region by the body region; a gate trench extending through the source and body regions and into the drift region, the gate trench including a gate electrode; and a field electrode in the gate trench or in a separate trench. The drift region has a generally linearly graded first doping profile which increases from the body region toward a bottom of the trench that includes the field electrode, and a graded second doping profile that increases at a greater rate than the first doping profile from an end of the first doping profile toward the drain region.

21 Claims, 13 Drawing Sheets

(51) Int. Cl.
    *H01L 29/08*     (2006.01)
    *H01L 29/10*     (2006.01)
    *H01L 29/40*     (2006.01)

(56) References Cited

U.S. PATENT DOCUMENTS

| | | |
|---|---|---|
| 11,158,735 B2 * | 10/2021 | Siemieniec ........... H01L 29/407 |
| 2002/0036319 A1 | 3/2002 | Baliga |
| 2005/0133858 A1 | 6/2005 | Banerjee et al. |
| 2007/0132013 A1 | 6/2007 | Banerjee et al. |
| 2009/0020832 A1 | 1/2009 | Peake et al. |
| 2014/0273374 A1 | 9/2014 | Yedinak et al. |
| 2019/0259871 A1 | 8/2019 | Matsuba et al. |

FOREIGN PATENT DOCUMENTS

| | | |
|---|---|---|
| DE | 102018107417 A1 | 10/2019 |
| EP | 1168455 A2 | 1/2002 |
| EP | 3142149 A1 | 3/2017 |

* cited by examiner

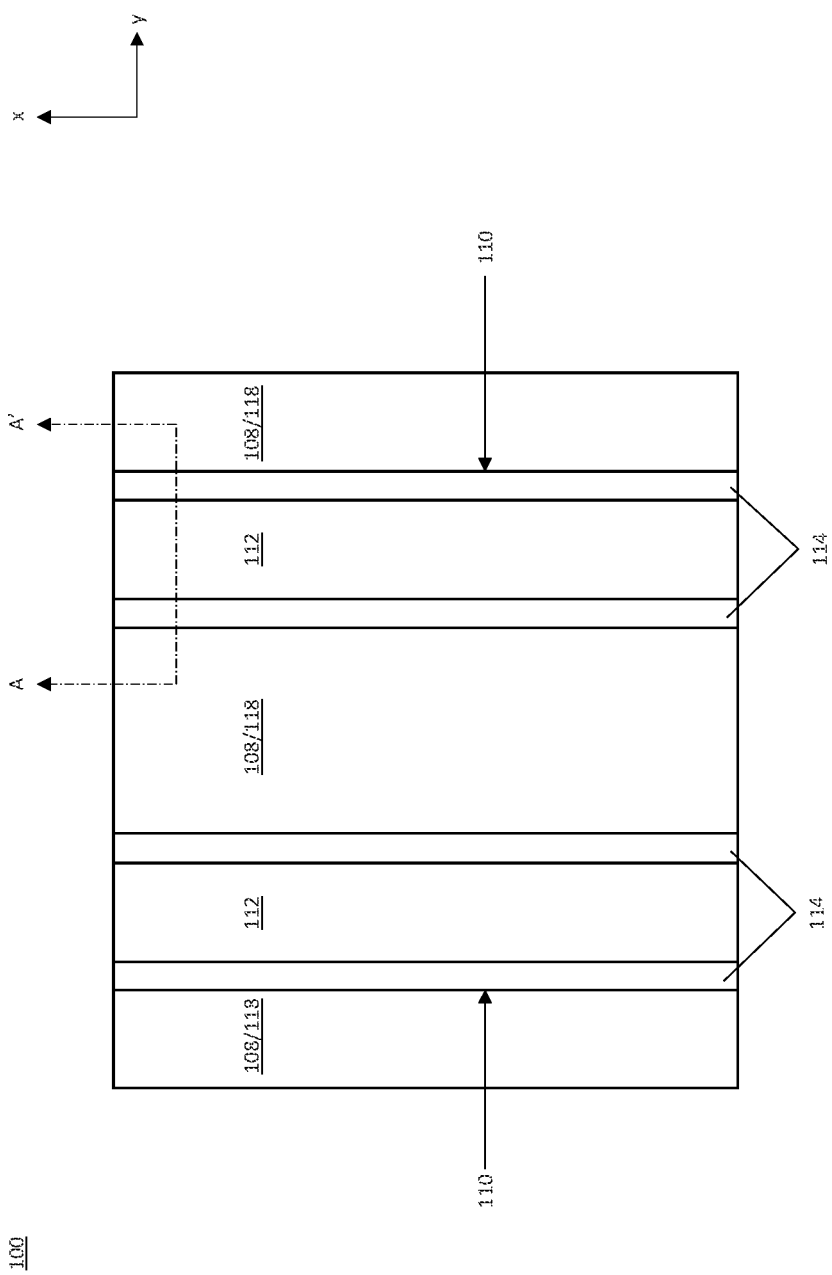

MOSFET HAVING A DRIFT REGION WITH A GRADED DOPING PROFILE AND METHODS OF MANUFACTURING THEREOF

BACKGROUND

Some types of power MOSFET (metal-oxide-semiconductor field effect transistor) employ insulated field-plate structures in deep trenches, enabling a much higher doping in the mesa region between the trenches due to lateral charge compensation. This is advantageous to realize a low on-resistance. It is also important to maintain good switching properties, low switching losses and a good device ruggedness at the same time.

Thus, there is a need for power MOSFET devices that optimize the parameters discussed above and methods of producing such power MOSFET devices.

SUMMARY

According to an embodiment of a vertical power semiconductor transistor device, the vertical power semiconductor transistor device comprises: a drain region of a first conductivity type; a body region of a second conductivity type opposite the first conductivity; a drift region of the first conductivity type and separating the body region from the drain region; a source region of the first conductivity type and separated from the drift region by the body region; a gate trench extending through the source region and the body region and into the drift region, the gate trench including a gate electrode; and a field electrode in the gate trench or in a separate trench, wherein the drift region has a generally linearly graded first doping profile which increases from the body region toward a bottom of the trench that includes the field electrode, and a graded second doping profile that increases at a greater rate than the first doping profile from an end of the first doping profile toward the drain region.

According to an embodiment of a method of producing a vertical power semiconductor transistor device, the method comprises: forming a drain region of a first conductivity type, a drift region of the first conductivity type, a body region of a second conductivity type opposite the first conductivity and which is separated from the drain region by the drift region, and a source region of the first conductivity type and which is separated from the drift region by the body region; forming a gate trench which extends through the source region and the body region and into the drift region, the gate trench including a gate electrode; forming a field electrode in the gate trench or in a separate trench; establishing a generally linearly graded first doping profile in the drift region and which increases from the body region toward a bottom of the trench that includes the field electrode; and establishing a graded second doping profile in the drift region and which increases at a greater rate than the first doping profile from an end of the first doping profile toward the drain region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1B illustrates a partial top plan view of the vertical power semiconductor transistor device shown in FIG. 1A.

DETAILED DESCRIPTION

The embodiments described provide a vertical power semiconductor transistor device having a drift region with a generally linearly graded first doping profile which increases from a body region of the vertical power semiconductor transistor device toward a bottom of a trench that includes a field electrode, and a graded second doping profile that increases at a greater rate than the first doping profile from an end of the first doping profile toward a drain region of the vertical power semiconductor transistor device. Related methods of producing a vertical power semiconductor transistor device with such a graded drift region are also described.

Optimizing the vertical doping profile of the drift region of a vertical power semiconductor transistor device as described herein yields improved device performance with lower on-resistance. For example, because the generally linearly graded first doping profile of the drift region extends through the main part of the compensated region of the device, the field peak at the body junction is relaxed compared to the case of a constant doping profile while still realizing an overall lower voltage drop over the mesa part between adjacent trenches. A lower field peak is beneficial to reduce DIBL (drain-induced barrier leakage), which gives more margin regarding parasitic turn-on. Having a lower surface doping concentration significantly simplifies the edge termination design. The graded second doping profile of the drift region effectively forms or works as a field-stop zone while allowing the extension of the electric field in case of an avalanche event linked to heavy generation of carriers, yielding improved avalanche ruggedness at the same time the voltage drops and as such the contribution to the overall on-resistance of the device is reduced. The electric field extends less into the drift region under normal operation conditions which reduces the number of excess carriers generated during body diode operation that must be removed during commutation. Hence, the reverse recovery charge is reduced which in turn lowers switching losses. The reverse recovery also has a softer behaviour and the device will generate substantially less electromagnetic disturbances, where softer switching amounts to less dv/dt and di/dt. The reduced on-resistance of the device also lowers associated Figures-of-Merit such as FOMg (Figure-of-Merit gate total charge), FOMgd (Figure-of-Merit gate drain charge) and FOMoss (Figure-of-Merit output charge). The shape of the small-signal output capacitance (Coss) is more linear, which is beneficial to reduce overshoot. Described next are various embodiments of a vertical power semiconductor transistor device having a drift region with a generally linearly graded (upper) first doping profile and a graded (lower) second doping profile that increases at a greater rate than the first doping profile.

Figure 1A:
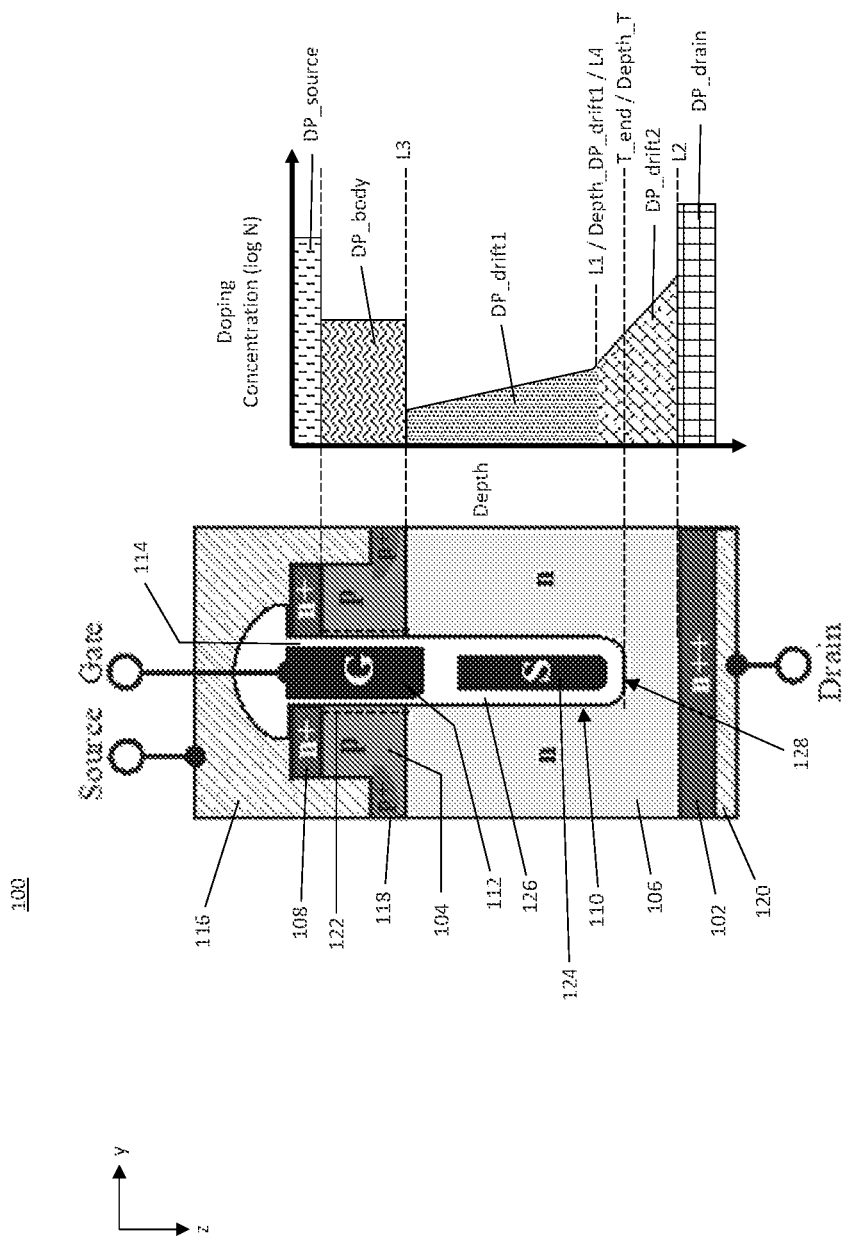
FIG. 1A illustrates a partial cross-sectional view of a vertical power semiconductor transistor device.

FIG. 1A illustrates a partial cross-sectional view of a vertical power semiconductor transistor device 100. FIG. 1B illustrates a partial top plan view of the vertical power semiconductor transistor device 100 shown in FIG. 1A. The partial cross-sectional view in FIG. 1A is taken along the line labeled A-A' in FIG. 1B.

The vertical power semiconductor transistor device 100 includes a drain region 102 of a first conductivity type, a body region 104 of a second conductivity type opposite the first conductivity, a drift region 106 of the first conductivity type and which separates the body region 104 from the drain region 102, and a source region 108 of the first conductivity type and which is separated from the drift region 106 by the body region 104. The first conductivity type is n-type and the second conductivity type is p-type in the case of an n-channel device. In the case of a p-channel device, the first conductivity type is p-type and the second conductivity type is n-type. For ease of illustration only, the first conductivity type is labeled n-type (e.g. 'n', 'n+', 'n++') and the second conductivity type is labeled p-type (e.g. 'p', 'p+') in FIG. 1A. The labels 'n', 'n+', 'n++', 'p', and 'p+' in FIG. 1A indicate general relative dopant concentration relationships among different regions of the same doping type and are not intended to be limiting with respect to particular doping concentrations, ranges or profiles. For example, a region labeled 'n+' indicates that the region is doped more heavily that a region labeled 'n' and a region labeled 'n++' indicates that the region is doped more heavily that a region labeled 'n+' or 'n'.

A gate trench 110 extends through the source region 108 and the body region 104 and into the drift region 106. The gate trench 100 includes a gate electrode 112 which is insulated from the surrounding semiconductor material by a gate dielectric 114. The gate electrode 112 may extend lengthwise (direction 'x' in FIG. 1B) in a stripe-like manner and/or form part of a grid. Directions 'x' and 'y' in FIGS. 1A and 1B are lateral (horizontal) directions which run perpendicular to one another and parallel to the front main surface of the device 100, whereas direction 'z' is a vertical direction which runs depth-wise into the device 100 and perpendicular to the front main surface of the device 100.

The vertical power semiconductor transistor device 100 also includes a source electrode 116 for providing a source potential ('Source') to the body region 104 and the source region 108 of the device 100. The body region 104 may include a heavily doped body contact region 118 to ensure an Ohmic contact between the source electrode 116 and the body region 104. A drain electrode 120 at the opposite side of the vertical power semiconductor transistor device 100 provides a drain potential (Drain) to the heavily doped drain region 102 of the device 100. A conductive channel region 122 arises in the body region 104 under appropriate biasing of the source electrode 116, drain electrode 120 and gate electrode 112 of the device 100.

According to the embodiment illustrated in FIGS. 1A and 1B, the vertical power semiconductor transistor device 100 also includes a field electrode 124 disposed in the same trench 110 as the gate electrode 112. The field electrode 124 is insulated from the gate electrode 112 and the surrounding semiconductor material by a field dielectric 126 which may be of the same material as the gate dielectric 114 or a different insulative material. The field electrode 124 may be biased at the source (S) potential, another potential, or floating.

The drift region 106 of the vertical power semiconductor transistor device 100 has a generally linearly graded (upper) first doping profile (DP_drain1) which increases from the body region 104 toward a bottom 128 of the trench 110 that includes the field electrode 124. The phrase "generally linearly graded" as used herein means, in a general manner, a rate of inclination that resembles a straight line. As such, the first doping profile (DP_drain1) of the drift region 106 may have one or more areas of localized nonlinearity due to process variation, material imperfections, etc., but overall increases like a straight line.

The drift region 106 also has a graded (lower) second doping profile (DP_drain2) that increases at a greater rate than the first doping profile from an end of the first doping profile toward the drain region 102. An exemplary source doping profile (DP_source), an exemplary body doping profile (DP_body), and an exemplary drain doping profile (DP_drain) are also shown in FIG. 1A to illustrate general relative doping concentration differences between the doped device regions 102, 104, 106, 108 of the vertical power semiconductor transistor device 100.

Figure 2A:
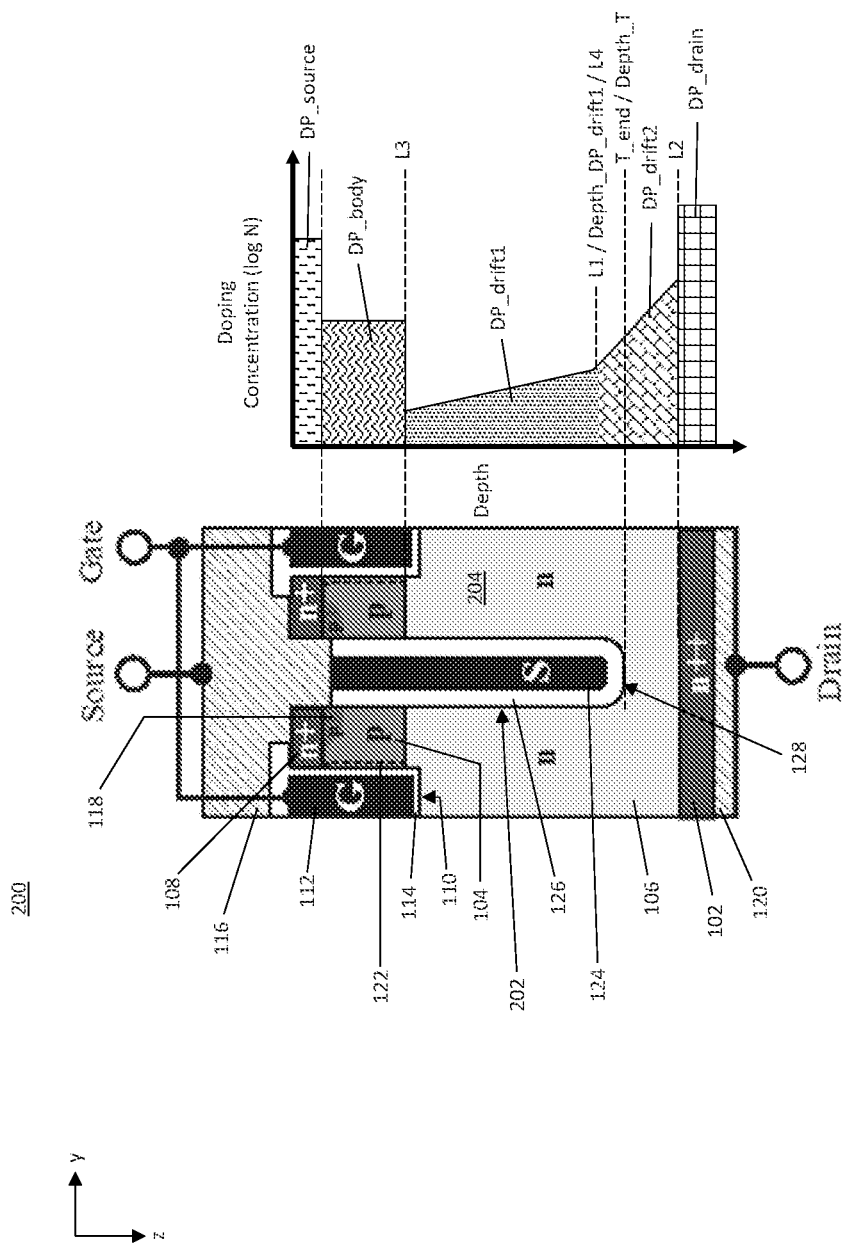
FIG. 2A illustrates a partial cross-sectional view of another embodiment of a vertical power semiconductor transistor device.
Figure 2B:
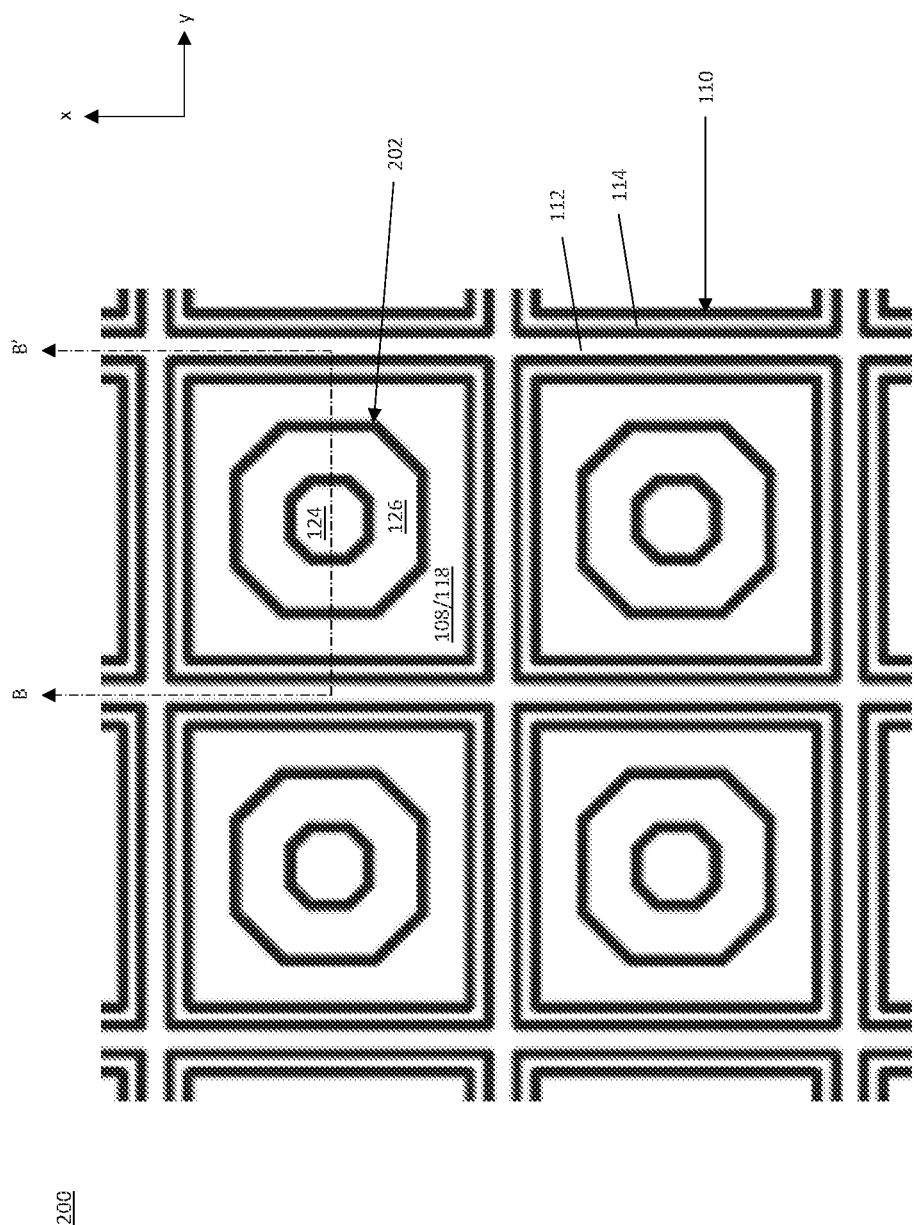
FIG. 2B illustrates a partial top plan view of the vertical power semiconductor transistor device shown in FIG. 2A.

FIG. 2A illustrates a partial cross-sectional view of another embodiment of a vertical power semiconductor transistor device 200. FIG. 2B illustrates a partial top plan view of the vertical power semiconductor transistor device 200 shown in FIG. 2A. The partial cross-sectional view in FIG. 2A is taken along the line labeled B-B' in FIG. 2B.

The embodiment illustrated in FIGS. 2A-2B is similar to the embodiment illustrated in FIGS. 1A-1B. Different, however, the field electrode 124 is in a different trench 202 than the gate electrode 112 and the field electrode 124 is needle-shaped in a lengthwise extension (direction 'z' in FIG. 2A) of the field electrode 124. The term "needle-shaped" as used herein describes an electrode structure having a small or narrow circumference or width in proportion to its height/depth in a semiconductor material, as opposed to a stripe-shaped electrode structure which is longer than it is deeper as shown in FIGS. 1A-1B. The gate trenches 110 may be formed as a grid, e.g., as shown in FIG. 2B or as stripes, e.g., as shown in FIG. 1B. In either case, the use of needle-shaped field-plate trenches 202 is beneficial as the remaining silicon mesa area 204 which surrounds each field plate trench 202 and defined by the adjacent gate trenches 110 is larger compared to the trench stripe structures shown in FIG. 1B, enabling a lower on-resistance.

For both the vertical power semiconductor transistor device 100 illustrated in FIGS. 1A-1B and the power semiconductor transistor device 200 illustrated in FIGS. 2A-2B, the second doping profile (DP_drain2) of the drift region 106 may be generally linearly graded like the first doping profile (DP_drain1) but increase at a greater slope than the generally linearly graded first doping profile.

For both the vertical power semiconductor transistor device 100 illustrated in FIGS. 1A-1B and the power semiconductor transistor device 200 illustrated in FIGS. 2A-2B, the second doping profile (DP_drain2) of the drift region 106 may be exponentially graded.

For both the vertical power semiconductor transistor device 100 illustrated in FIGS. 1A-1B and the power semiconductor transistor device 200 illustrated in FIGS. 2A-2B, the second doping profile (DP_drain2) of the drift region 106 may increase from a first doping level L1 adjacent the first doping profile (DP_drain1) to a second doping level L2 adjacent the drain region 102, the second doping level L2 being in a range of 10 times to 100 times greater than the first doping level L1.

The first and second doping levels L1, L2 for the second doping profile (DP_drain2) of the drift region 106 may vary depending on the voltage class of the device 100, 200. For example, in the case of a 100 V device, the drift region 106 may have a doping level L3 around the pn-junction with the body region 104 of about 1e16 cm-3 and increase to a level L1 of between about 2.4 to 3e16 cm-3. The doping concentration of the drift region 106 increases from level L1 to a level L2 of about (e.g. +/−10%) 3e17 cm-3 or greater at or near the drain region 102. A doping level L2 of about 3e17 cm-3 at or near the drain region 102 may be dominated by n-type dopants that diffused out from the drain region 102. In general, doping levels L1, L2, L3 of the drift region may vary from voltage class to voltage class and may even vary within one voltage class, depending on the optimization scheme applied. In one embodiment, the first doping level L1 is in a range between 1e15 cm-3 and 1e17 cm-3 and the second doping level L2 is in a range between 1e17 cm-3 and 1e19 cm-3.

For both the vertical power semiconductor transistor device 100 illustrated in FIGS. 1A-1B and the power semiconductor transistor device 200 illustrated in FIGS. 2A-2B, the first doping profile (DP_drain1) of the drift region 106 may end and the second doping profile (DP_drain2) of the drift region 106 may begin at or near a level (T_end) within the drift region 106 which corresponds to the bottom 128 of the trench 110 that includes the field electrode 124.

For both the vertical power semiconductor transistor device 100 illustrated in FIGS. 1A-1B and the power semiconductor transistor device 200 illustrated in FIGS. 2A-2B, the first doping profile (DP_drain1) of the drift region 106 may extend to a depth (Depth_DP_drift1) of at least ¾ (three-fourths) of the depth (Depth_T) of the trench 110/202 that includes the field electrode 124.

For both the vertical power semiconductor transistor device 100 illustrated in FIGS. 1A-1B and the power semiconductor transistor device 200 illustrated in FIGS. 2A-2B, the first doping profile (DP_drain1) of the drift region 106 may increase from a first doping level L3 adjacent the body region 104 to a second doping level L4 adjacent the second doping profile (DP_drain2) of the drift region 106, and the second doping level L4 of the first doping profile (DP_drain1) may be at least three times greater than the first doping level L3 of the first doping profile (DP_drain1).

Described next are embodiments of producing the vertical power semiconductor transistor devices 100, 200 illustrated in FIGS. 1A-1B and 2A-2B.

Figure 3A:
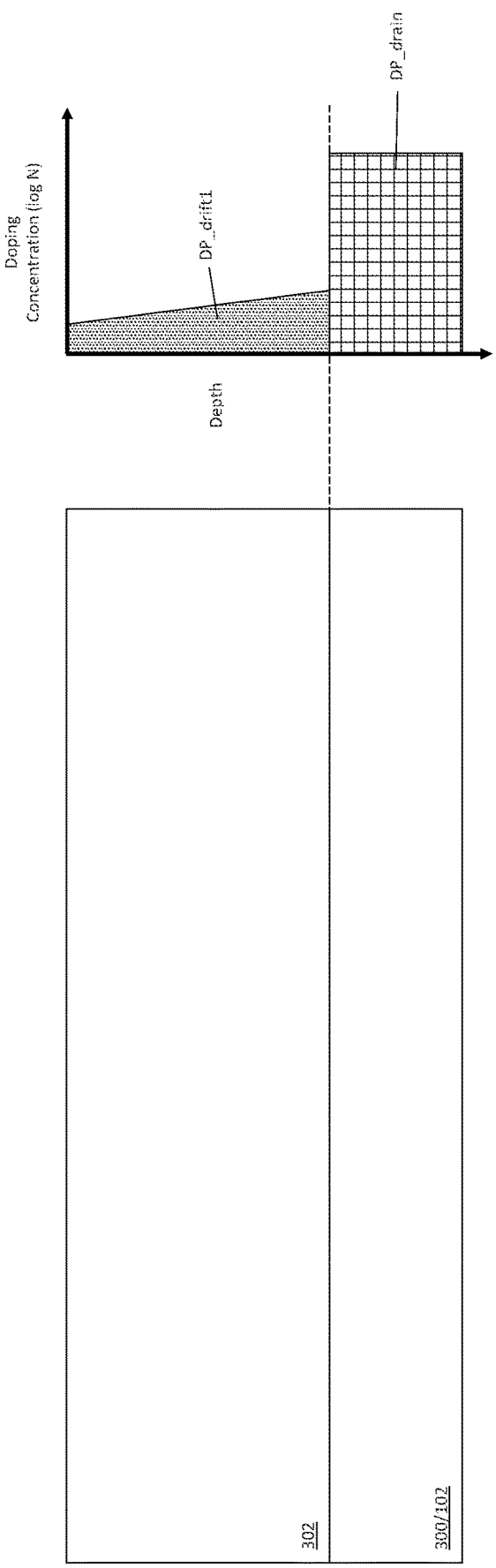
FIGS. 3A-3B illustrate an embodiment of producing the vertical power semiconductor transistor devices illustrated in FIGS. 1A-1B and 2A-2B.
Figure 3B:
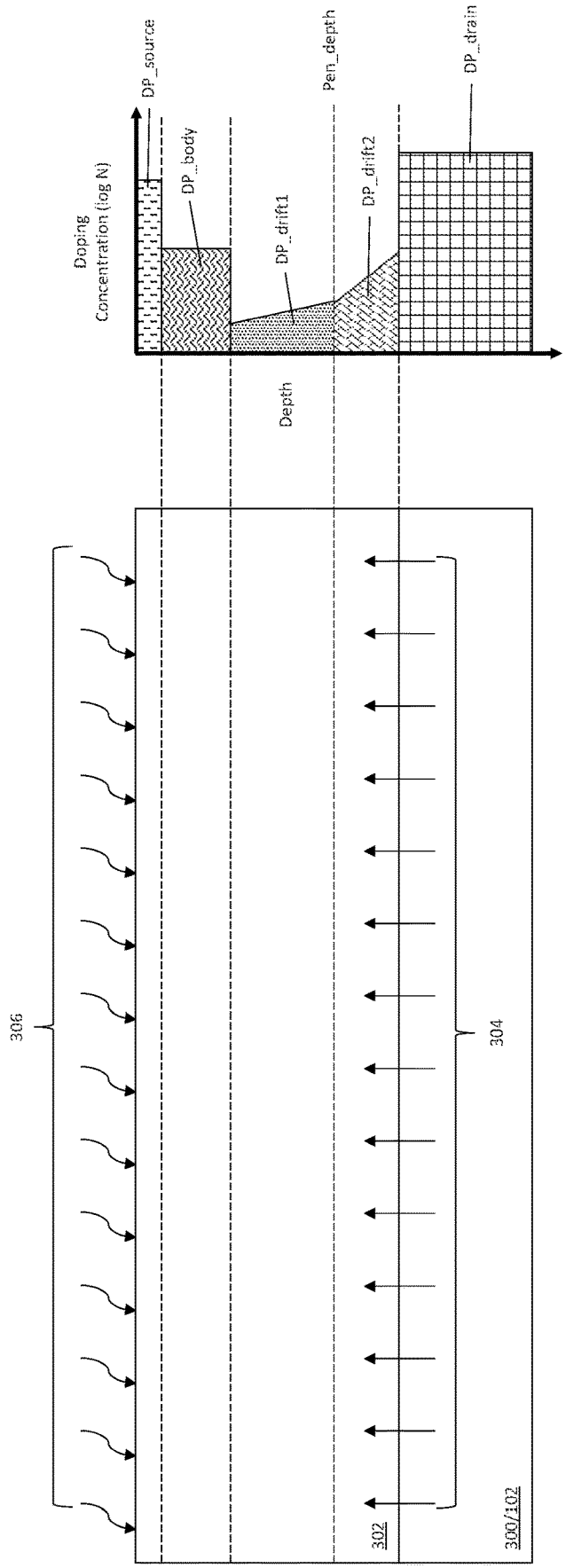

FIGS. 3A-3B illustrate an embodiment of producing the vertical power semiconductor transistor devices 100,200 illustrated in FIGS. 1A-1B and 2A-2B. According to this embodiment, the drain region 102 is formed by a semiconductor substrate 300 of the first conductivity type. For example, the semiconductor substrate 300 may be a Si substrate.

FIG. 3A shows a single epitaxial layer 302 grown on the semiconductor substrate 300. All device regions other than the drain region 102 are to be formed in the single epitaxial layer 302, according to this embodiment. The single epitaxial layer 302 is doped during or after deposition to have the generally linearly graded first doping profile (DP_drift1) throughout. For example, impurities such as arsine, phosphine, diborane, etc. may be added to a source gas in a controlled manner during the epitaxy deposition process to yield the generally linearly graded first doping profile (DP_drift1) throughout the single epitaxial layer 302. The generally linearly graded first doping profile (DP_drift1) may instead be realized after epitaxial growth, e.g., by implantation or diffusion.

FIG. 3B shows out-diffusing of dopants 304 of the first conductivity from the semiconductor substrate 300 into the adjoining single epitaxial layer 302. The out-diffused dopants 304 of the first conductivity reach a penetration depth (Pen_depth) within the single epitaxial layer 302 as measured from the semiconductor substrate 300. The penetration depth (Pen_depth) is less than the thickness of the final drift region 106. The out-diffused dopants 304 of the first conductivity convert the generally linearly graded first doping profile (DP_drift1) to the graded second doping profile (DP_drift2) over the penetration depth (Pen_depth). In one embodiment, the penetration depth (Pen_depth) and hence the thickness of the part of the final drift region 106 having the graded second doping profile (DP_drift2) is in a range of about 3 to 4 μm. The part of the final drift region 106 having the graded second doping profile (DP_drift2) may, however, be thinner than 3 μm or thicker than 4 μm.

The final drift region 106 has the generally linearly graded (upper) first doping profile (DP_drain1) established by the initial doping profile of the single epitaxial layer 302, and the graded (lower) second doping profile (DP_drain2) established by the out-diffusion of dopants 304 of the first conductivity from the semiconductor substrate 300 into the adjoining single epitaxial layer 302. The body region 104 of the second conductivity type and the source region 108 of the first conductivity type are also formed in the single epitaxial layer 302 above the drift region 106. The gate trench 110 and the field electrode 124 in the gate trench 110 or in a separate trench 202 are also formed in the single epitaxial layer 302. Standard semiconductor processing such as photolithography, masking, etching, ion implantation, annealing, etc. may be used to form these regions of the vertical power semiconductor transistor devices 100, 200 illustrated in FIGS. 1A-1B and 2A-2B.

For example, dopants of the second conductivity type may be implanted into the single epitaxial layer 302 to form the body region 104 and dopants of the first conductivity type may be implanted into the single epitaxial layer 302 to form the source region 108. The single epitaxial layer 302 may be annealed at least once to electrically activate the dopants implanted into the single epitaxial layer 302, to form the body, drift and source regions 104, 106, 108 of the device 100/200. In one embodiment, dopants 304 of the first conductivity out-diffuse from the semiconductor substrate 300 into the adjoining single epitaxial layer 302 by thermal processing 306 applied to activate the respective dopants of the body region 104 and the source region 108. The body, drift and source regions 104, 106, 108 along with the trench structures are omitted from FIG. 3B for ease of illustration. However, doping concentration profiles (DP_body, DP_drift1, DP_drift2, DP_source) for the body, drift and source regions 104, 106, 108 are shown in FIG. 3B relative to the position of these regions in the single epitaxial layer 302.

Figure 4A:
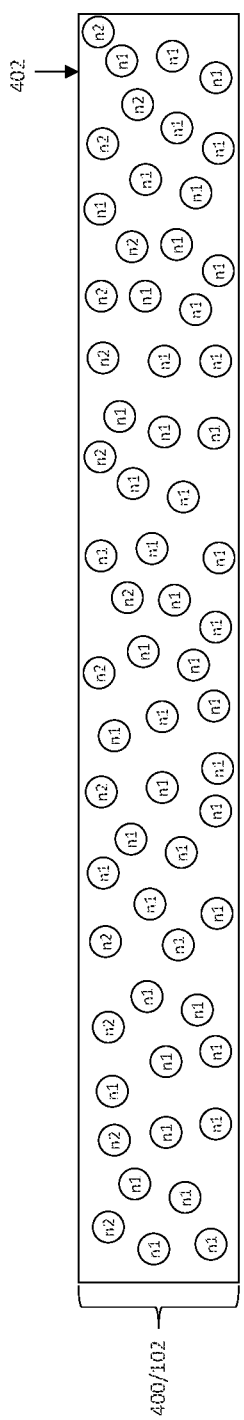
FIGS. 4A-4B illustrate another embodiment of producing the vertical power semiconductor transistor devices illustrated in FIGS. 1A-1B and 2A-2B.
Figure 4B:
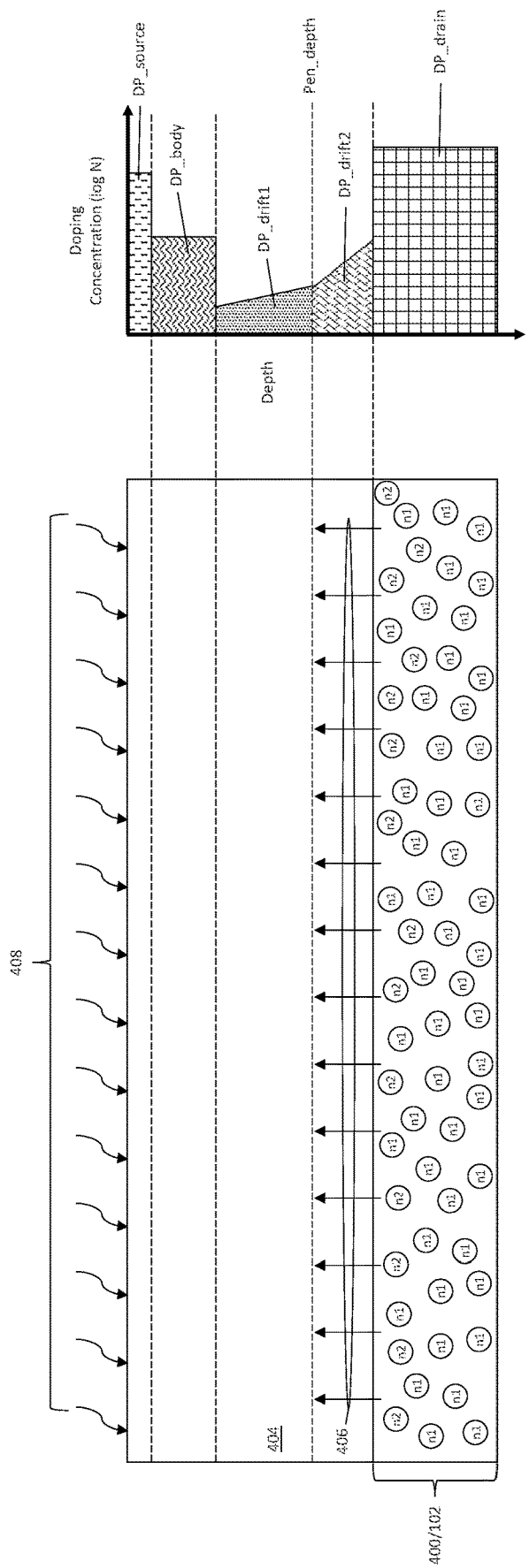

FIGS. 4A-4B illustrate another embodiment of producing the vertical power semiconductor transistor devices 100, 200 illustrated in FIGS. 1A-1B and 2A-2B. According to this embodiment, the drain region 102 is formed by a semiconductor substrate 400 of the first conductivity type such as an appropriately doped Si substrate.

FIG. 4A shows the semiconductor substrate 400 doped with first dopants n1 of the first conductivity type. The semiconductor substrate 400 is also provided with second dopants n2 of the first conductivity type which have a faster diffusion rate than the first dopants n1 of the first conductivity type. For example, in the case of Si as the material of the substrate 400, the second dopants n2 of the first conductivity type may be phosphorus and the first dopants n1 of the first conductivity type may be arsenic or antimony. The second dopants n2 of the first conductivity type may be implanted or diffused into the semiconductor substrate 400, e.g., at an epitaxial growth side 402 of the substrate 400.

FIG. 4B shows a single epitaxial layer 404 grown on the epitaxial growth side 402 of the semiconductor substrate 400. The single epitaxial layer 404 has the generally linearly graded first doping profile (DP_drift1) throughout and all device regions other than the drain region 102 are to be formed in the single epitaxial layer 404, as explained above in connection with FIGS. 3A-3B.

FIG. 4B also shows out-diffusing of dopants 406 of the first conductivity type from the epitaxial growth side 402 of the semiconductor substrate 400 into the adjoining single epitaxial layer 404. More of the second dopants n2 of the first conductivity type out-diffuse from the semiconductor substrate 400 into the adjoining single epitaxial layer 404 than the first dopants n1 of the first conductivity type due to the diffusion rate difference explained above. The out-diffused dopants 406 of the first conductivity reach a penetration depth (Pen_depth) within the single epitaxial layer 404 and convert the generally linearly graded first doping profile (DP_drift1) to the graded second doping profile (DP_drift2) over the penetration depth (Pen_depth), as explained above in connection with FIGS. 3A-3B.

The final drift region 106 has the generally linearly graded (upper) first doping profile (DP_drain1) established by the initial doping profile of the single epitaxial layer 404, and the graded (lower) second doping profile (DP_drain2) established by the out-diffusion of dopants 406 of the first conductivity from the semiconductor substrate 400 into the adjoining single epitaxial layer 402. As explained above in connection with FIGS. 3A-3B, the dopants 406 of the first conductivity may out-diffuse from the semiconductor substrate 400 into the adjoining single epitaxial layer 404 by thermal processing 408 applied to activate the respective dopants of the body region 104 and the source region 108 of the device 100/200. The body, drift and source regions 104, 106, 108 along with the trench structures are omitted from FIG. 4B for ease of illustration. However, doping concentration profiles (DP_body, DP_drift1, DP_drift2, DP_source) for the body, drift and source regions 104, 106, 108 are shown in FIG. 4B relative to the position of these regions in the single epitaxial layer 404.

Figure 5A:
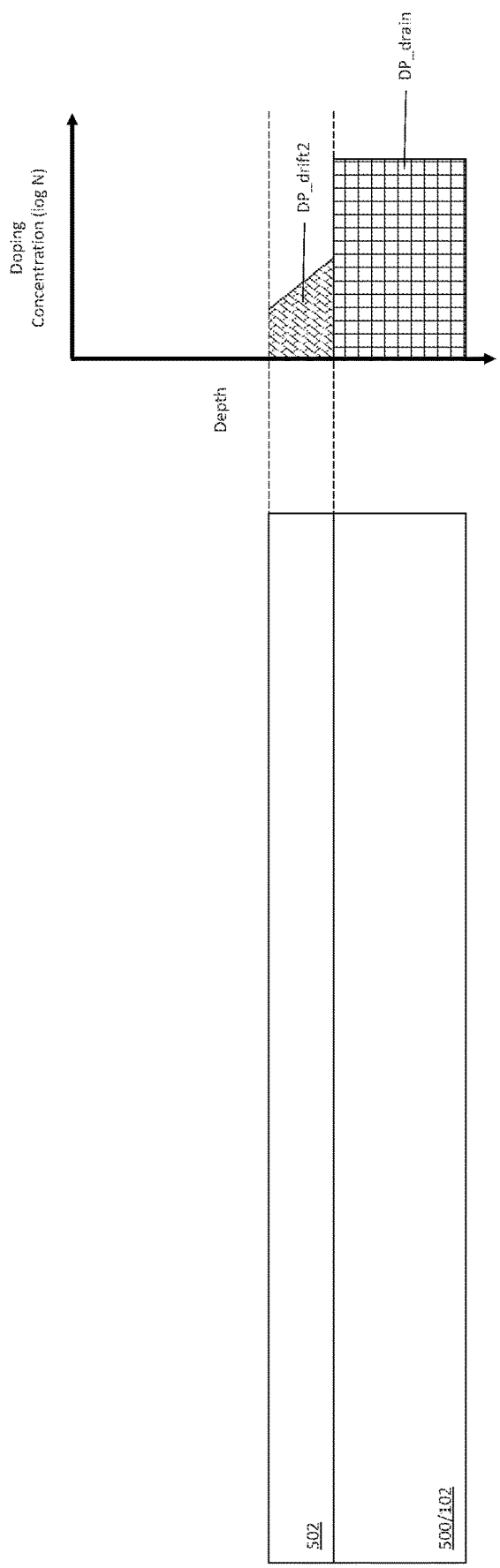
FIGS. 5A-5B illustrate another embodiment of producing the vertical power semiconductor transistor devices illustrated in FIGS. 1A-1B and 2A-2B.
Figure 5B:
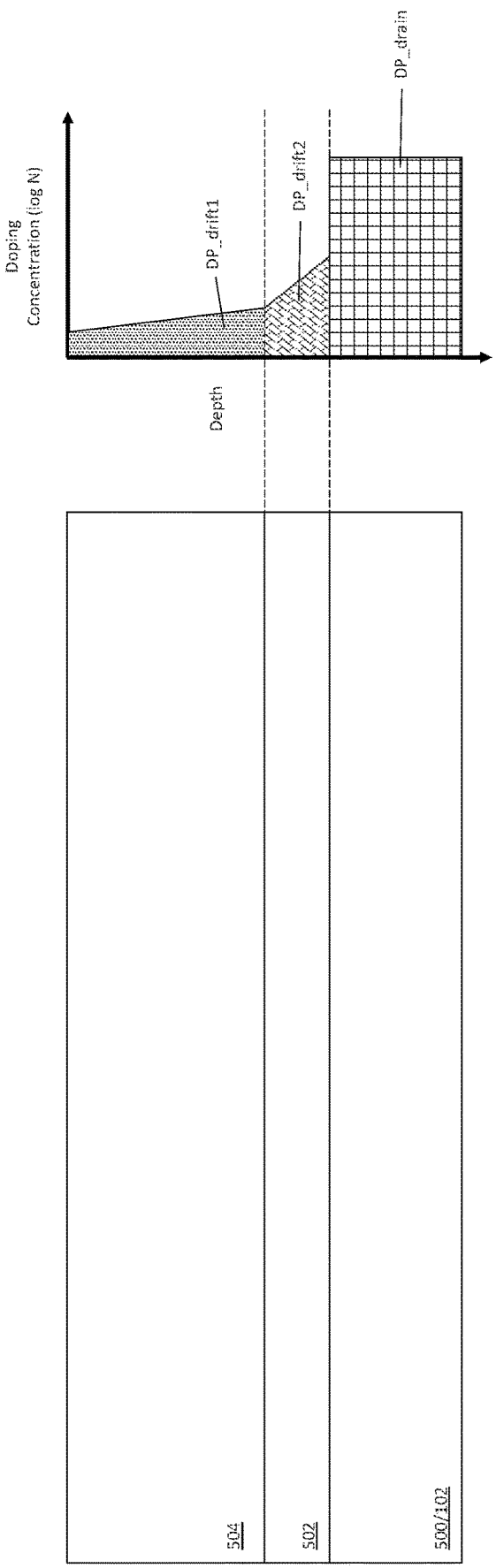

FIGS. 5A-5B illustrate another embodiment of producing the vertical power semiconductor transistor devices 100, 200 illustrated in FIGS. 1A-1B and 2A-2B. According to this embodiment, the drain region 102 is formed by a semiconductor substrate 500 of the first conductivity type such as an appropriately doped Si substrate.

FIG. 5A shows a first epitaxial layer 502 grown on the semiconductor substrate 500. The first epitaxial layer 502 is doped during or after deposition to have the graded (lower) second doping profile (DP_drift2) for the final drift region 106. For example, impurities such as arsine, phosphine, diborane, etc. may be added to a source gas in a controlled manner during the epitaxy deposition process to yield the graded second doping profile (DP_drift2) within the first epitaxial layer 502. The graded second doping profile (DP_drift2) may instead be realized after epitaxial growth, e.g., by implantation or diffusion.

FIG. 5B shows a second epitaxial layer 504 grown on the first epitaxial layer 502. The second epitaxial layer 504 is doped during or after deposition to have the generally linearly graded (upper) first doping profile (DP_drain1) for the final drift region 106. For example, impurities such as arsine, phosphine, diborane, etc. may be added to a source gas in a controlled manner during the epitaxy deposition process to yield the generally linearly graded first doping profile (DP_drain1) within the second epitaxial layer 504. The generally linearly graded first doping profile (DP_drain1) may instead be realized after epitaxial growth, e.g., by implantation or diffusion.

In one embodiment, the first epitaxial layer 502 is thinner than the second epitaxial layer 504. The combined thickness of the first epitaxial layer 502 and the second epitaxial layer 504 may be selected based on the blocking voltage requirement for the device 100/200. The body region 104 of the second conductivity type and the source region 108 of the first conductivity type are formed in the second epitaxial layer 504 above the drift region 106. The gate trench 110 and the field electrode 124 in the gate trench 110 or in a separate trench 202 are also formed in the second epitaxial layer 504 and may extend into the first epitaxial layer 502. Standard semiconductor processing such as photolithography, masking, etching, ion implantation, annealing, etc. may be used to form these regions of the vertical power semiconductor transistor devices 100, 200 illustrated in FIGS. 1A-1B and 2A-2B. The body, drift and source regions 104, 106, 108 along with the trench structures are omitted from FIG. 5B for ease of illustration.

Figure 6A:
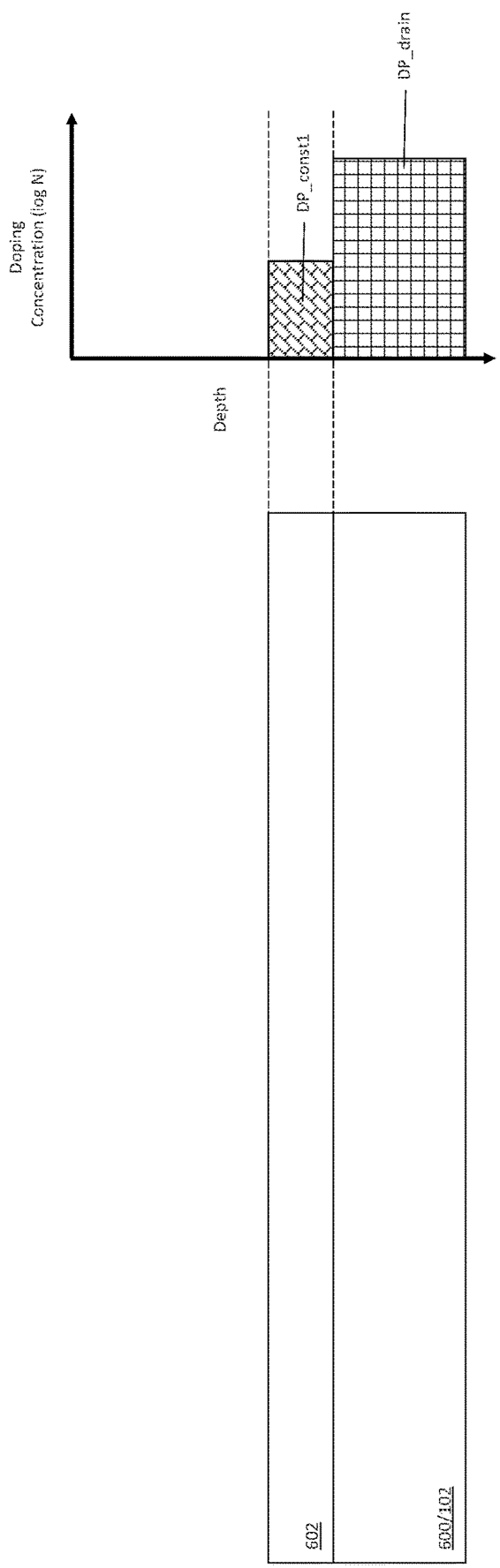
FIGS. 6A-6C illustrate another embodiment of producing the vertical power semiconductor transistor devices illustrated in FIGS. 1A-1B and 2A-2B.
Figure 6B:
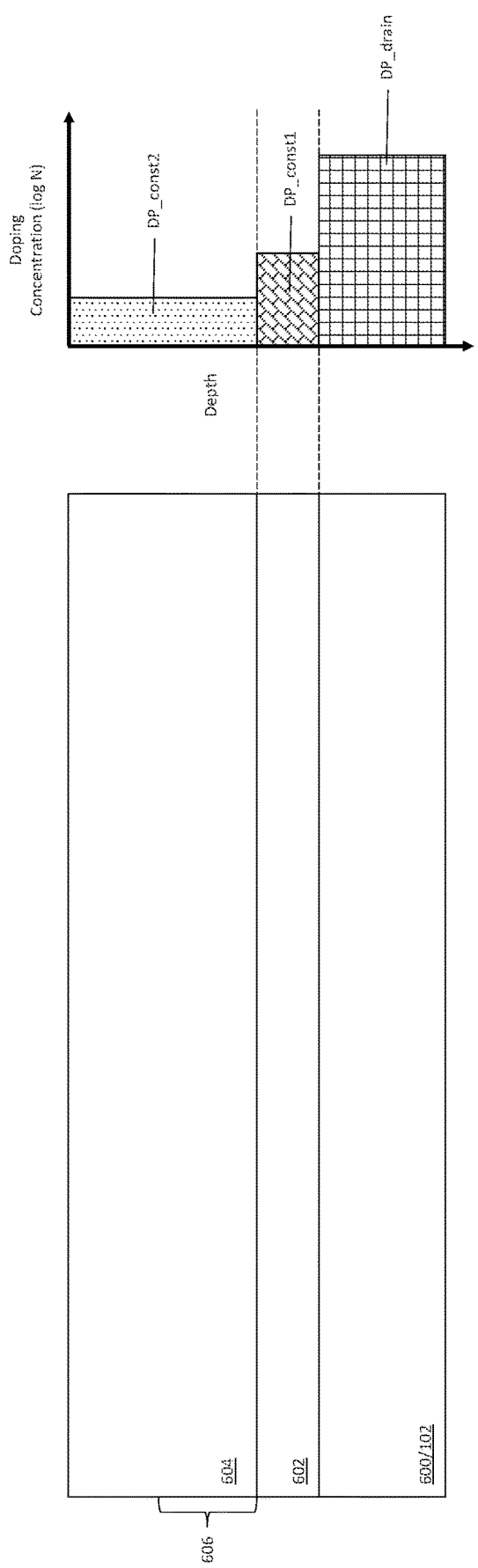

FIGS. 6A-6B illustrate another embodiment of producing the vertical power semiconductor transistor devices 100, 200 illustrated in FIGS. 1A-1B and 2A-2B. According to this embodiment, the drain region 102 is formed by a semiconductor substrate 600 of the first conductivity type such as an appropriately doped Si substrate.

FIG. 6A shows a first epitaxial layer 602 grown on the semiconductor substrate 600. The first epitaxial layer 602 is doped during or after deposition to have a first constant doping profile (DP_const1). For example, impurities such as arsine, phosphine, diborane, etc. may be added to a source gas in a controlled manner during the epitaxy deposition process to yield the first constant doping profile (DP_const1) within the first epitaxial layer 602. The first constant doping profile (DP_const1) may instead be realized after epitaxial growth, e.g., by implantation or diffusion.

FIG. 6B shows a second epitaxial layer 604 grown on the first epitaxial layer 602. The second epitaxial layer 604 is doped during or after deposition to have a second constant doping profile (DP_const2) and a lower average doping concentration than the first epitaxial layer 602. For example, impurities such as arsine, phosphine, diborane, etc. may be added to a source gas in a controlled manner during the epitaxy deposition process to yield the second constant doping profile (DP_const2) within the second epitaxial layer 604. The second constant doping profile (DP_const2) may instead be realized after epitaxial growth, e.g., by implantation or diffusion.

Figure 6C:
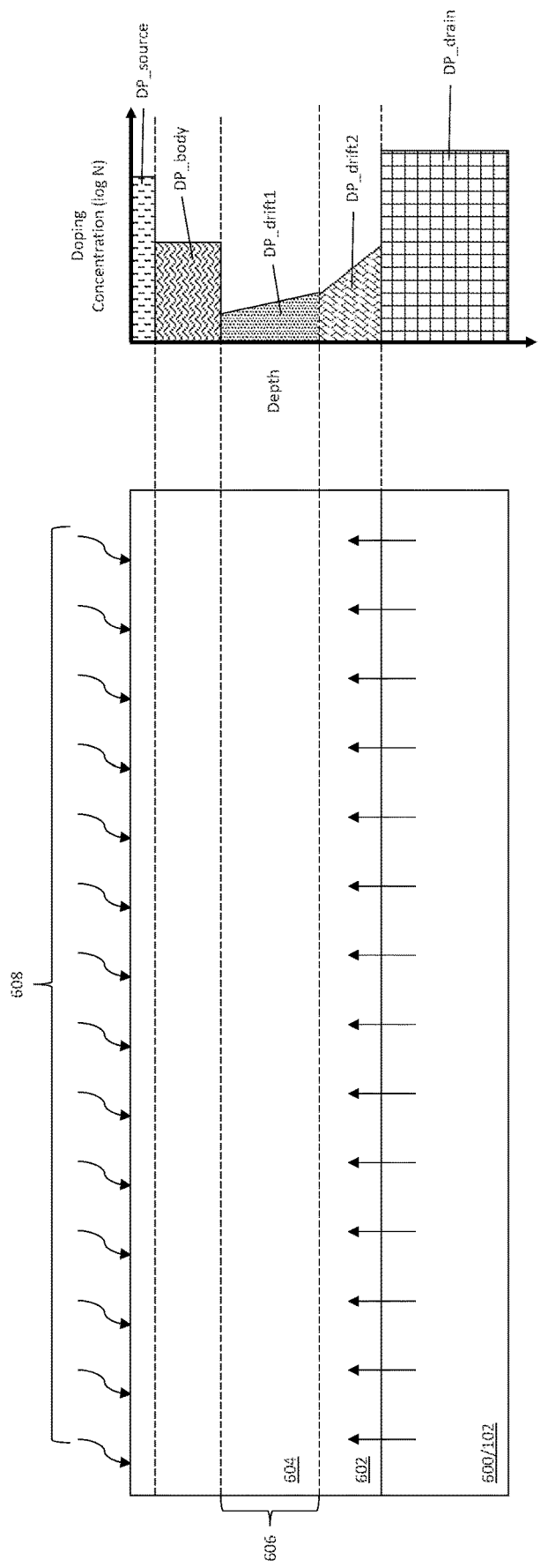

FIG. 6C shows dopants of the first conductivity being out-diffused from the semiconductor substrate 600 into the adjoining first epitaxial layer 602. For example, as explained above in connection with FIG. 3B, dopants of the first conductivity may be out-diffused from the semiconductor substrate 600 into the adjoining first epitaxial layer 602 by subsequent thermal processing 608 applied during formation of the body and source regions 104, 108. In another example, as explained above in connection with FIG. 4B, the semiconductor substrate 600 may be doped with first dopants of the first conductivity type and provided with second dopants of the first conductivity type and which have a faster diffusion rate than the first dopants. Subsequent thermal processing 608 causes the second dopants of the first conductivity to out-diffuse from the semiconductor substrate 600 into the first epitaxial layer 602. In each case, the out-diffused dopants of the first conductivity convert the first constant doping profile (DP_const1) to the graded second doping profile (DP_drain2) in the first epitaxial layer 602.

The thermal processing 608 applied during formation of the body and source regions 104, 108 and the associated diffusion processes also convert the second constant doping profile (DP_const2) in the second epitaxial layer 604 to the generally linearly graded first doping profile (DP_drain2) in a drift region section 606 of the second epitaxial layer 604. The body and source regions 104, 108 are formed in the second epitaxial layer 604 above the drift region section 606. The gate trench 110 and the field electrode 124 in the gate trench 110 or in a separate trench 202 are also formed in the second epitaxial layer 604 and may extend into the first epitaxial layer 602. Standard semiconductor processing such as photolithography, masking, etching, ion implantation, annealing, etc. may be used to form these regions of the vertical power semiconductor transistor devices 100, 200 illustrated in FIGS. 1A-1B and 2A-2B. The body, drift and source regions 104, 106, 108 along with the trench structures are omitted from FIG. 6B for ease of illustration. However, doping concentration profiles (DP_body, DP_drift1, DP_drift2, DP_source) for the body, drift and source regions 104, 106, 108 are shown in FIG. 6B relative to the position of these regions in the first and second epitaxial layers 602, 604.

Although the present disclosure is not so limited, the following numbered examples demonstrate one or more aspects of the disclosure.

Example 1. A vertical power semiconductor transistor device, comprising: a drain region of a first conductivity type; a body region of a second conductivity type opposite the first conductivity; a drift region of the first conductivity type and separating the body region from the drain region; a source region of the first conductivity type and separated from the drift region by the body region; a gate trench extending through the source region and the body region and into the drift region, the gate trench including a gate electrode; and a field electrode in the gate trench or in a separate trench, wherein the drift region has a generally linearly graded first doping profile which increases from the body region toward a bottom of the trench that includes the field electrode, and a graded second doping profile that increases at a greater rate than the first doping profile from an end of the first doping profile toward the drain region.

Example 2. The vertical power semiconductor transistor device of example 1, wherein the second doping profile is generally linearly graded and increases at a greater slope than the generally linearly graded first doping profile.

Example 3. The vertical power semiconductor transistor device of example 1, wherein the second doping profile is exponentially graded.

Example 4. The vertical power semiconductor transistor device of any of examples 1 through 3, wherein the second doping profile increases from a first doping level adjacent the first doping profile to a second doping level adjacent the drain region, and wherein the second doping level is in a range of 10 times to 100 times greater than the first doping level.

Example 5. The vertical power semiconductor transistor device of example 4, wherein the vertical power semiconductor transistor device is rated for 100V, wherein the first doping level is in a range between 2.4e16 cm$^{-3}$ and 3e16 cm$^{-3}$, and wherein the second doping level is about 3e17 cm$^{-3}$ or greater.

Example 6. The vertical power semiconductor transistor device of any of examples 1 through 5, wherein the first doping profile ends and the second doping profile begins at or near a level within the drift region which corresponds to the bottom of the trench that includes the field electrode.

Example 7. The vertical power semiconductor transistor device of any of examples 1 through 6, wherein the field electrode is in a different trench than the gate electrode, and wherein the field electrode is needle-shaped in a lengthwise extension of the field electrode.

Example 8. The vertical power semiconductor transistor device of any of examples 1 through 7, wherein the first doping profile of the drift region extends to a depth of at least ¾ of a depth of the trench that includes the field electrode.

Example 9. The vertical power semiconductor transistor device of any of examples 1 through 8, wherein the first doping profile increases from a first doping level adjacent the body region to a second doping level adjacent the second doping profile, and wherein the second doping level is at least three times greater than the first doping level.

Example 10. The vertical power semiconductor transistor device of any of examples 1 through 9, wherein the drain region is formed by a semiconductor substrate of the first conductivity type, wherein the drift region, the body region and the source region are formed in a single epitaxial layer grown on the semiconductor substrate, wherein the semiconductor substrate is doped with first dopants of the first conductivity type, wherein the second doping profile for the drift region arises from second dopants of the first conductivity type which out-diffused from the semiconductor substrate, and wherein the second dopants have a faster diffusion rate than the first dopants.

Example 11. The vertical power semiconductor transistor device of any of examples 1 through 9, wherein the drain region is formed by a semiconductor substrate of the first conductivity type, wherein the second doping profile for the drift region is present in a first epitaxial layer grown on the semiconductor substrate, wherein the first doping profile for the drift region is present in a second epitaxial layer grown on the first epitaxial layer, and wherein in the drift region the first epitaxial layer is thinner than the second epitaxial layer and has a higher average doping concentration.

Example 12. A method of producing a vertical power semiconductor transistor device, the method comprising: forming a drain region of a first conductivity type, a drift region of the first conductivity type, a body region of a second conductivity type opposite the first conductivity and which is separated from the drain region by the drift region, and a source region of the first conductivity type and which is separated from the drift region by the body region; forming a gate trench which extends through the source region and the body region and into the drift region, the gate trench including a gate electrode; forming a field electrode in the gate trench or in a separate trench; establishing a generally linearly graded first doping profile in the drift region and which increases from the body region toward a bottom of the trench that includes the field electrode; and establishing a graded second doping profile in the drift region and which increases at a greater rate than the first doping profile from an end of the first doping profile toward the drain region.

Example 13. The method of example 12, wherein the second doping profile is generally linearly graded and increases at a greater slope than the generally linearly graded first doping profile, or wherein the second doping profile is exponentially graded.

Example 14. The method of example 12 or 13, wherein the drain region is formed by a semiconductor substrate of the first conductivity type, and wherein establishing the graded second doping profile in the drift region comprises: growing a single epitaxial layer on the semiconductor substrate, the single epitaxial layer having the generally linearly graded first doping profile throughout; and out-diffusing dopants of the first conductivity from the semiconductor substrate into the adjoining single epitaxial layer, the out-diffused dopants of the first conductivity reaching a penetration depth within the single epitaxial layer as measured from the semiconductor substrate and which is less than the thickness of the drift region, the out-diffused dopants of the first conductivity converting the generally linearly graded first doping profile to the graded second doping profile over the penetration depth.

Example 15. The method of example 14, wherein the dopants of the first conductivity are out-diffused from the semiconductor substrate into the adjoining single epitaxial layer by thermal processing applied during formation of the body region and the source region.

Example 16. The method of example 14, wherein the semiconductor substrate is doped with first dopants of the first conductivity type, and wherein out-diffusing the dopants of the first conductivity from the semiconductor substrate into the adjoining single epitaxial layer comprises: providing second dopants of the first conductivity type in the semiconductor substrate, the second dopants having a faster diffusion rate than the first dopants; and after providing the second dopants and after growing the single epitaxial layer, applying thermal processing which out-diffuses the second dopants of the first conductivity from the semiconductor substrate into the adjoining single epitaxial layer to the penetration depth.

Example 17. The method of examples 12 or 13, wherein the drain region is formed by a semiconductor substrate of the first conductivity type, and wherein establishing the graded second doping profile in the drift region comprises: growing a first epitaxial layer on the semiconductor substrate, the first epitaxial layer having the graded second doping profile; and growing a second epitaxial layer on the first epitaxial layer, the second epitaxial layer having the generally linearly graded first doping profile, wherein the first epitaxial layer is thinner than the second epitaxial layer.

Example 18. The method of examples 12 or 13, wherein the drain region is formed by a semiconductor substrate of the first conductivity type, and wherein establishing the graded second doping profile in the drift region comprises: growing a first epitaxial layer on the semiconductor substrate, the first epitaxial layer having a first constant doping profile; growing a second epitaxial layer on the first epitaxial layer, the second epitaxial layer having a second constant doping profile and a lower average doping concentration than the first epitaxial layer; out-diffusing dopants of the first conductivity from the semiconductor substrate into the adjoining first epitaxial layer, the out-diffused dopants of the first conductivity converting the first constant doping profile to the graded second doping profile in the first epitaxial layer; and converting the second constant doping profile to the generally linearly graded first doping profile in a drift region section of the second epitaxial layer by thermal processing applied during formation of the body region and the source region.

Example 19. The method of example 18, wherein the dopants of the first conductivity are out-diffused from the semiconductor substrate into the adjoining first epitaxial layer by thermal processing applied during formation of the body region and the source region.

Example 20. The method of example 18, wherein the semiconductor substrate is doped with first dopants of the first conductivity type, and wherein out-diffusing the dopants of the first conductivity from the semiconductor substrate into the adjoining first epitaxial layer comprises: providing second dopants of the first conductivity type in the semiconductor substrate, the second dopants having a faster diffusion rate than the first dopants; and after providing the second dopants and after growing the first epitaxial layer, applying thermal processing which causes the second dopants of the first conductivity to out-diffuse from the semiconductor substrate into the first epitaxial layer.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical power semiconductor transistor device, comprising:
a drain region of a first conductivity type;
a body region of a second conductivity type opposite the first conductivity;

a drift region of the first conductivity type and separating the body region from the drain region;

a source region of the first conductivity type and separated from the drift region by the body region;

a gate trench extending through the source region and the body region and into the drift region, the gate trench including a gate electrode; and a field electrode in at least one of the gate trench and/or in a separate trench, wherein the trench that includes the field electrode terminates before reaching the drain region such that a bottom of the trench that includes the field electrode is separated from the drain region by a section of the drift region, wherein the drift region has a first doping profile which increases from the body region toward the bottom of the trench that includes the field electrode, and a second doping profile that increases at a greater rate than the first doping profile from an end of the first doping profile toward the drain region.

2. The vertical power semiconductor transistor device of claim 1, wherein the second doping profile is generally linearly graded and increases at a greater slope than the generally linearly graded first doping profile.

3. The vertical power semiconductor transistor device of claim 1, wherein the second doping profile is exponentially graded.

4. The vertical power semiconductor transistor device of claim 1, wherein the second doping profile increases from a first doping level adjacent the first doping profile to a second doping level adjacent the drain region, and wherein the second doping level is in a range of 10 times to 100 times greater than the first doping level.

5. The vertical power semiconductor transistor device of claim 1, wherein the section of the drift region that separates the bottom of the trench that includes the field electrode from the drain region has the graded second doping profile.

6. The vertical power semiconductor transistor device of claim 1, wherein the first doping profile ends and the second doping profile begins at or near a level within the drift region which corresponds to the bottom of the trench that includes the field electrode.

7. The vertical power semiconductor transistor device of claim 1, wherein the field electrode is in a different trench than the gate electrode, and wherein the field electrode is needle-shaped in a lengthwise extension of the field electrode.

8. The vertical power semiconductor transistor device of claim 1, wherein the first doping profile of the drift region extends to a depth of at least ¾ of a depth of the trench that includes the field electrode.

9. The vertical power semiconductor transistor device of claim 1, wherein the first doping profile increases from a first doping level adjacent the body region to a second doping level adjacent the second doping profile, and wherein the second doping level is at least three times greater than the first doping level.

10. The vertical power semiconductor transistor device of claim 1, wherein the drain region is formed by a semiconductor substrate of the first conductivity type, wherein the drift region, the body region and the source region are formed in a single epitaxial layer grown on the semiconductor substrate, wherein the semiconductor substrate is doped with first dopants of the first conductivity type, wherein the second doping profile for the drift region arises from second dopants of the first conductivity type which out-diffused from the semiconductor substrate, and wherein the second dopants have a faster diffusion rate than the first dopants.

11. The vertical power semiconductor transistor device of claim 1, wherein the drain region is formed by a semiconductor substrate of the first conductivity type, wherein the second doping profile for the drift region is present in a first epitaxial layer grown on the semiconductor substrate, wherein the first doping profile for the drift region is present in a second epitaxial layer grown on the first epitaxial layer, and wherein in the drift region the first epitaxial layer is thinner than the second epitaxial layer and has a higher average doping concentration.

12. A method of producing a vertical power semiconductor transistor device, the method comprising:

forming a drain region of a first conductivity type, a drift region of the first conductivity type, a body region of a second conductivity type opposite the first conductivity and which is separated from the drain region by the drift region, and a source region of the first conductivity type and which is separated from the drift region by the body region;

forming a gate trench which extends through the source region and the body region and into the drift region, the gate trench including a gate electrode;

forming a field electrode in at least one of the gate trench and a separate trench, wherein the trench that includes the field electrode terminates before reaching the drain region such that a bottom of the trench that includes the field electrode is separated from the drain region by a section of the drift region;

establishing a first doping profile in the drift region and which increases from the body region toward the bottom of the trench that includes the field electrode; and establishing a second doping profile in the drift region and which increases at a greater rate than the first doping profile from an end of the first doping profile toward the drain region.

13. The method of claim 12, wherein the second doping profile is generally linearly graded and increases at a greater slope than the generally linearly graded first doping profile, or wherein the second doping profile is exponentially graded.

14. The method of claim 12, wherein the drain region is formed by a semiconductor substrate of the first conductivity type, and wherein establishing the graded second doping profile in the drift region comprises:

growing a single epitaxial layer on the semiconductor substrate, the single epitaxial layer having the generally linearly graded first doping profile throughout; and out-diffusing dopants of the first conductivity from the semiconductor substrate into the adjoining single epitaxial layer, the out-diffused dopants of the first conductivity reaching a penetration depth within the single epitaxial layer as measured from the semiconductor substrate and which is less than the thickness of the drift region, the out-diffused dopants of the first conductivity converting the generally linearly graded first doping profile to the graded second doping profile over the penetration depth.

15. The method of claim 14, wherein the dopants of the first conductivity are out-diffused from the semiconductor substrate into the adjoining single epitaxial layer by thermal processing applied during formation of the body region and the source region.

16. The method of claim 14, wherein the semiconductor substrate is doped with first dopants of the first conductivity type, and wherein out-diffusing the dopants of the first conductivity from the semiconductor substrate into the adjoining single epitaxial layer comprises:
    providing second dopants of the first conductivity type in the semiconductor substrate, the second dopants having a faster diffusion rate than the first dopants; and
    after providing the second dopants and after growing the single epitaxial layer, applying thermal processing which out-diffuses the second dopants of the first conductivity from the semiconductor substrate into the adjoining single epitaxial layer to the penetration depth.

17. The method of claim 12, wherein the drain region is formed by a semiconductor substrate of the first conductivity type, and wherein establishing the graded second doping profile in the drift region comprises:
    growing a first epitaxial layer on the semiconductor substrate, the first epitaxial layer having the graded second doping profile; and
    growing a second epitaxial layer on the first epitaxial layer, the second epitaxial layer having the generally linearly graded first doping profile,
    wherein the first epitaxial layer is thinner than the second epitaxial layer.

18. The method of claim 12, wherein the drain region is formed by a semiconductor substrate of the first conductivity type, and wherein establishing the graded second doping profile in the drift region comprises:
    growing a first epitaxial layer on the semiconductor substrate, the first epitaxial layer having a first constant doping profile;
    growing a second epitaxial layer on the first epitaxial layer, the second epitaxial layer having a second constant doping profile and a lower average doping concentration than the first epitaxial layer;
    out-diffusing dopants of the first conductivity from the semiconductor substrate into the adjoining first epitaxial layer, the out-diffused dopants of the first conductivity converting the first constant doping profile to the graded second doping profile in the first epitaxial layer; and
    converting the second constant doping profile to the generally linearly graded first doping profile in a drift region section of the second epitaxial layer by thermal processing applied during formation of the body region and the source region.

19. The method of claim 18, wherein the dopants of the first conductivity are out-diffused from the semiconductor substrate into the adjoining first epitaxial layer by thermal processing applied during formation of the body region and the source region.

20. The method of claim 18, wherein the semiconductor substrate is doped with first dopants of the first conductivity type, and wherein out-diffusing the dopants of the first conductivity from the semiconductor substrate into the adjoining first epitaxial layer comprises:
    providing second dopants of the first conductivity type in the semiconductor substrate, the second dopants having a faster diffusion rate than the first dopants; and
    after providing the second dopants and after growing the first epitaxial layer, applying thermal processing which causes the second dopants of the first conductivity to out-diffuse from the semiconductor substrate into the first epitaxial layer.

21. The method of claim 12, wherein establishing the graded second doping profile in the drift region comprises:
    establishing the graded second doping profile in the section of the drift region that separates the bottom of the trench that includes the field electrode from the drain region.

* * * * *

UNITED STATES PATENT AND TRADEMARK OFFICE
CERTIFICATE OF CORRECTION

PATENT NO. : 11,848,379 B2
APPLICATION NO. : 17/482490
DATED : December 19, 2023
INVENTOR(S) : R. Siemieniec et al.

Page 1 of 1

It is certified that error appears in the above-identified patent and that said Letters Patent is hereby corrected as shown below:

In the Claims

Column 13, Lines 8-9 (Claim 1, Lines 13-14) please change "and/or in a" to -- and a --

Signed and Sealed this
Twenty-seventh Day of February, 2024

Katherine Kelly Vidal
*Director of the United States Patent and Trademark Office*